(12) United States Patent
Ozeki et al.

(10) Patent No.: US 10,753,576 B2
(45) Date of Patent: Aug. 25, 2020

(54) LIGHT EMITTING DEVICE WITH A LIGHT TRANSMISSIVE MEMBER AND METHOD OF MANUFACTURING SAME

(71) Applicant: NICHIA CORPORATION, Anan-shi, Tokushima (JP)

(72) Inventors: Kenji Ozeki, Tokushima (JP); Masami Nishi, Myouzai-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/195,082

(22) Filed: Nov. 19, 2018

(65) Prior Publication Data
US 2019/0154236 A1 May 23, 2019

(30) Foreign Application Priority Data
Nov. 20, 2017 (JP) ................................. 2017-222968

(51) Int. Cl.
*F21V 9/32* (2018.01)
*H01L 33/58* (2010.01)
*F21S 41/00* (2018.01)
*H01L 33/54* (2010.01)
*H01L 25/075* (2006.01)
*H01L 33/50* (2010.01)

(52) U.S. Cl.
CPC ................ *F21V 9/32* (2018.02); *F21S 41/00* (2018.01); *H01L 33/54* (2013.01); *H01L 33/58* (2013.01); *H01L 25/0753* (2013.01); *H01L 33/505* (2013.01); *H01L 2933/0033* (2013.01); *H01L 2933/0058* (2013.01)

(58) Field of Classification Search
CPC . F21V 9/32; H01L 33/54; H01L 33/58; H01L 33/505; H01L 2933/0033; H01L 2933/0058; H01L 25/0753; F21S 41/00
See application file for complete search history.

(56) References Cited

U.S. PATENT DOCUMENTS

2010/0264438 A1* 10/2010 Suenaga ................. H01L 33/58
257/98
2013/0127331 A1 5/2013 Tsutsumi et al.
(Continued)

FOREIGN PATENT DOCUMENTS

JP 2010-272847 A 12/2010
JP 2012-38889 A 2/2012
(Continued)

*Primary Examiner* — Tracie Y Green
(74) *Attorney, Agent, or Firm* — Birch, Stewart, Kolasch & Birch, LLP

(57) ABSTRACT

A light emitting device includes a light emitting element, a light-transmissive member, a covering member, and a base member. The light-transmissive member has a flange on a lateral surface thereof in such a manner as to continue from a periphery of an upper surface to a periphery of a lower surface of the light-transmissive member and to be positioned outside the upper surface of the light-transmissive member and an upper surface of the light emitting element in plan view. The flange has a thin portion at an inner side than the outer edge side of the flange. The thin portion has a thickness smaller than a thickness of the outer edge side of the flange.

16 Claims, 11 Drawing Sheets

(56) References Cited

U.S. PATENT DOCUMENTS

| | | | |
|---|---|---|---|
| 2013/0285091 A1* | 10/2013 | Akimoto | H01L 33/44 257/98 |
| 2015/0001563 A1* | 1/2015 | Miki | H01L 33/54 257/98 |
| 2015/0102366 A1 | 4/2015 | Wada | |
| 2015/0263254 A1* | 9/2015 | Miyoshi | H01L 33/505 257/98 |
| 2016/0079486 A1* | 3/2016 | Sugimoto | H01L 25/0753 257/88 |
| 2017/0054064 A1 | 2/2017 | Shichijo et al. | |
| 2017/0155022 A1 | 6/2017 | Tomonari et al. | |
| 2017/0248281 A1 | 8/2017 | Ozeki | |

FOREIGN PATENT DOCUMENTS

| | | |
|---|---|---|
| JP | 2015-0128081 A | 1/2015 |
| JP | 2015-79805 A | 4/2015 |
| JP | 2017-41477 A | 2/2017 |
| JP | 2017-108091 A | 6/2017 |
| JP | 2017-157610 A | 9/2017 |
| JP | 2017-183427 A | 10/2017 |

* cited by examiner

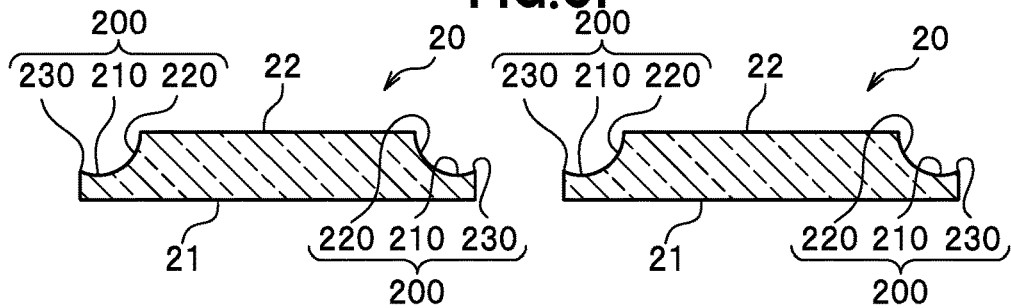
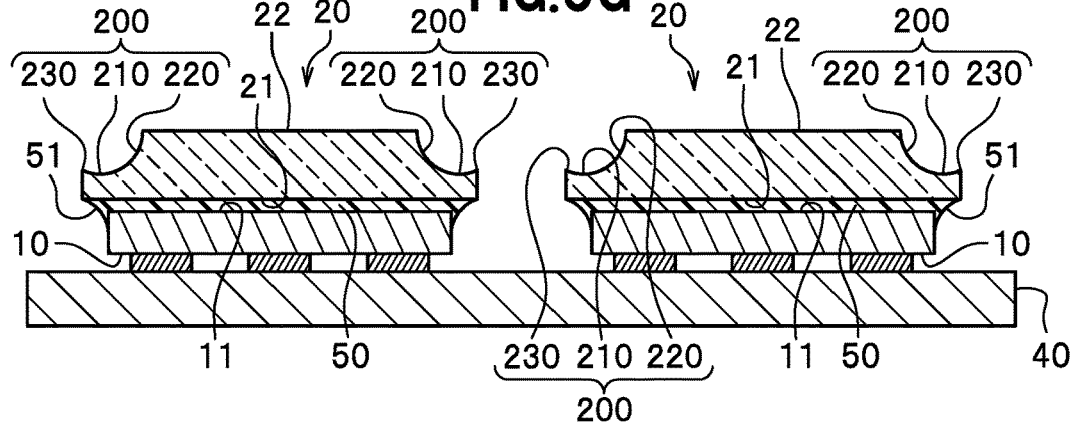
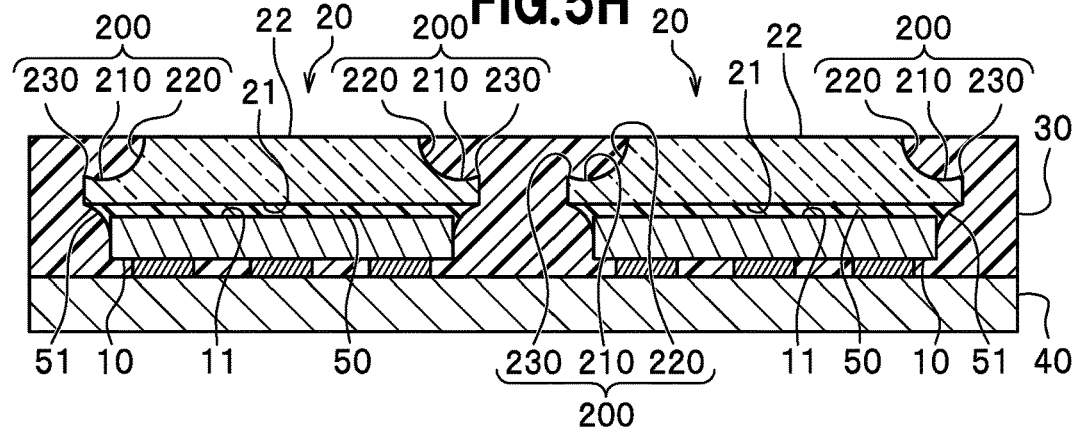
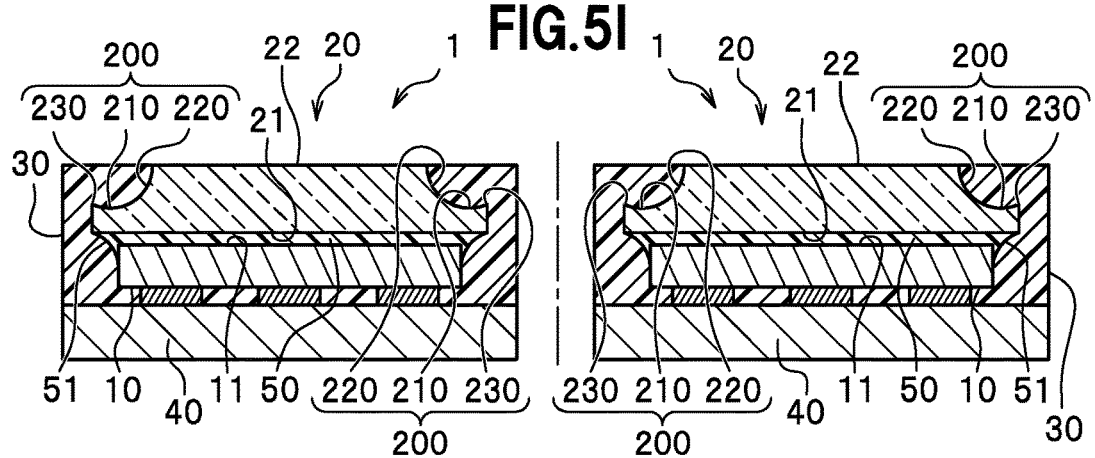

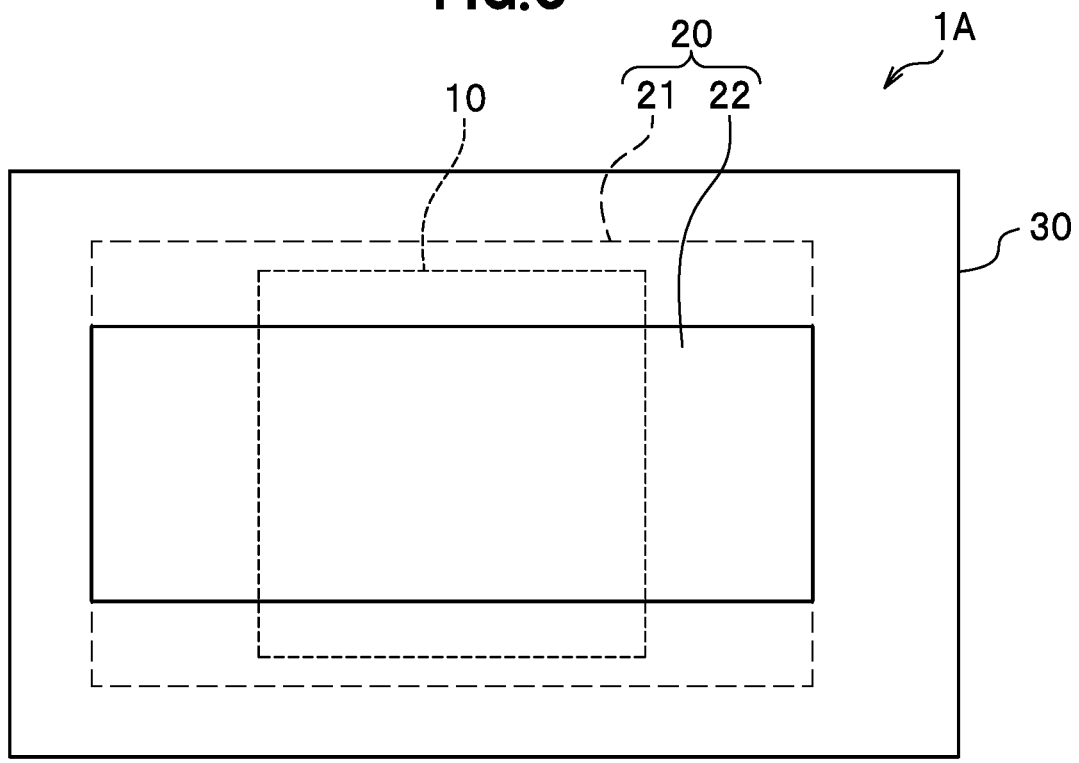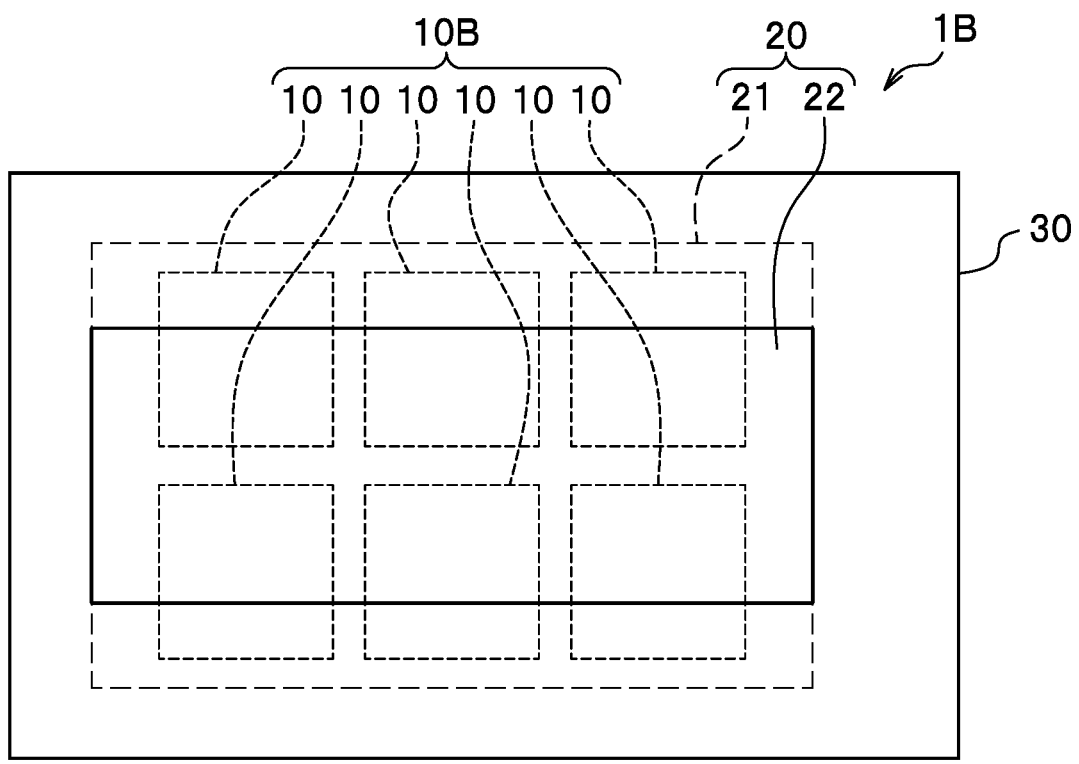

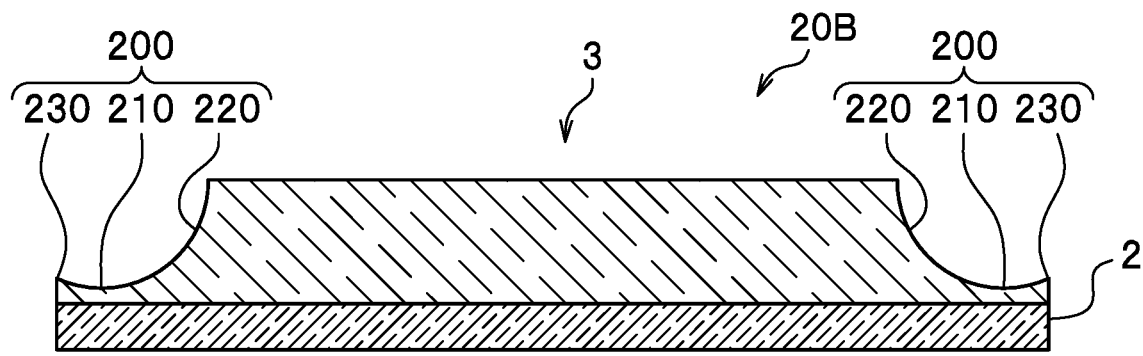
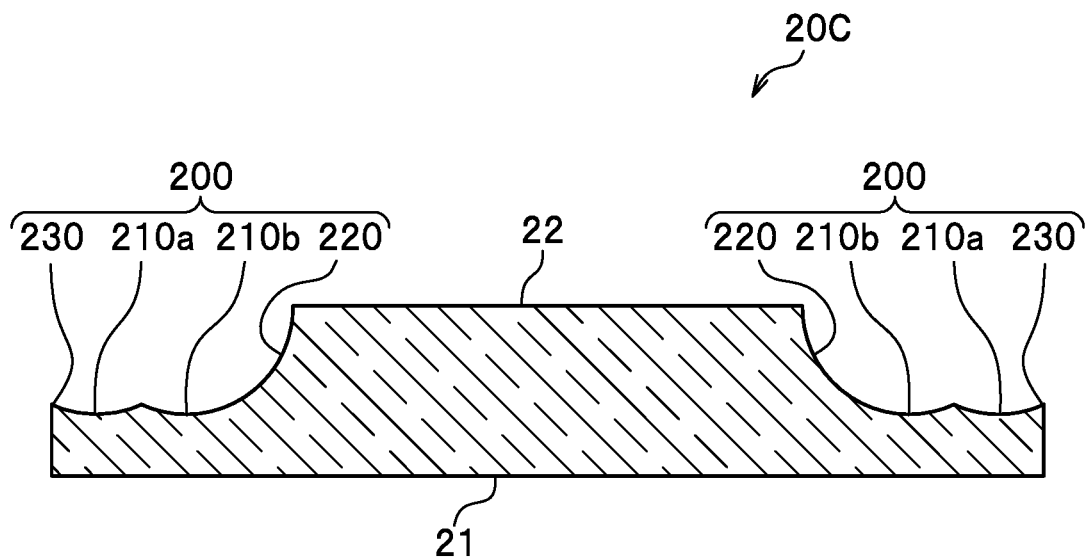

LIGHT EMITTING DEVICE WITH A LIGHT TRANSMISSIVE MEMBER AND METHOD OF MANUFACTURING SAME

CROSS-REFERENCE TO RELATED APPLICATION

This application claims priority to Japanese Patent Application No. 2017-222968, filed on Nov. 20, 2017, the disclosure of which is hereby incorporated by reference in its entirety.

BACKGROUND

The present disclosure relates to a light emitting device, and a method of manufacturing the light emitting device.

Light emitting devices using light emitting elements are commonly used for headlights, interior and exterior lightings of vehicles. As one example, a light emitting device includes a light emitting element, a light-transmissive member bonded to the upper surface of the light emitting element, and a covering member exposing the upper surface of the light-transmissive member (see Unexamined Patent Application Publication No. 2017-108091). The light emitting device is capable of emitting light with a high luminance because the area of an upper surface of the light-transmissive member is smaller than the area of a lower surface of the light-transmissive member.

However, the light emitting device is required to prevent or reduce leakage of light, and emit light with a high luminance.

SUMMARY

An object of certain embodiment according to the present disclosure is to provide a light emitting device with a higher luminance, and a method of manufacturing the light emitting device.

The light emitting device according to the embodiment of the present disclosure includes a light emitting element, a light-transmissive member, a covering member. The light emitting element has an upper surface serving as a light extraction surface. The light-transmissive member which is joined to the upper surface of the light emitting element, has a lower surface larger than the upper surface of the light emitting element and an upper surface smaller than the lower surface, and allows light emitted from the light emitting element to enter from the lower surface and exit from the upper surface of the light-transmissive member. The covering member covers a lateral surface of the light-transmissive member such that the upper surface of the light-transmissive member is exposed from the covering member. The light-transmissive member has a flange on at least a part of the lateral surface thereof in such a manner as to continue from a periphery of the upper surface to a periphery of the lower surface of the light-transmissive member and to be positioned outside the upper surface of the light-transmissive member and the upper surface of the light emitting element in plan view. The flange has a thin portion at an inner side than the outer edge side of the flange. The thin portion has a thickness smaller than a thickness of the outer edge side of the flange.

The method of manufacturing a light emitting device according to the embodiment of the present disclosure includes: forming a groove portion on an upper surface of a light-transmissive substrate having a plate shape; forming a light-transmissive member by dividing the light-transmissive substrate at a position including the groove portion, such that the light-transmissive member has a lower surface larger than an upper surface serving as a light extraction surface of a light emitting element, and an upper surface smaller than the lower surface, and having a flange which continues from a periphery of the upper surface to a periphery of the lower surface of the light-transmissive member, the flange being positioned outside the upper surface of the light-transmissive member and the upper surface of the light emitting element in plan view; and bonding the lower surface of the light-transmissive member and the upper surface of the light emitting element to each other. The step of forming the light-transmissive member includes forming a thin portion at an inner side than an outer edge side of the flange, and the thin portion has a thickness smaller than a thickness of the outer edge side of the flange.

The light emitting device and the method of manufacturing the light emitting device according to the embodiment of the present disclosure can realize that prevention or reduction in light leakage and emit light with a higher luminance by creating a thin portion on the flange.

BRIEF DESCRIPTION OF THE DRAWINGS

FIG. 5F is an explanatory diagram schematically showing a state in which the light-transmissive substrate is members are divided into individual light transmissive members in the method of manufacturing a light emitting device according to the embodiment.

FIG. 5G is an explanatory diagram schematically showing a state in which the light emitting element and the light-transmissive member are bonded to a base member in the method of manufacturing a light emitting device according to the embodiment.

FIG. 5H is an explanatory diagram schematically showing a state in which a covering member is provided on the periphery of the light emitting element and the light-transmissive member in the method of manufacturing a light emitting device according to the embodiment.

FIG. 5I is an explanatory diagram schematically showing a state in which the base member and the cover member are cut and divided into individual light emitting devices in the method of manufacturing a light emitting device according to the embodiment.

FIG. 6 is a plan view of a light emitting device in Modification 1.

FIG. 7 is a plan view of a light emitting device in Modification 2.

FIG. 9 is a sectional view of a light-transmissive member of a light emitting device in Modification 4.

FIG. 10 is a sectional view of a light-transmissive member of a light emitting device in Modification 5.

DETAILED DESCRIPTION

Figure 1:
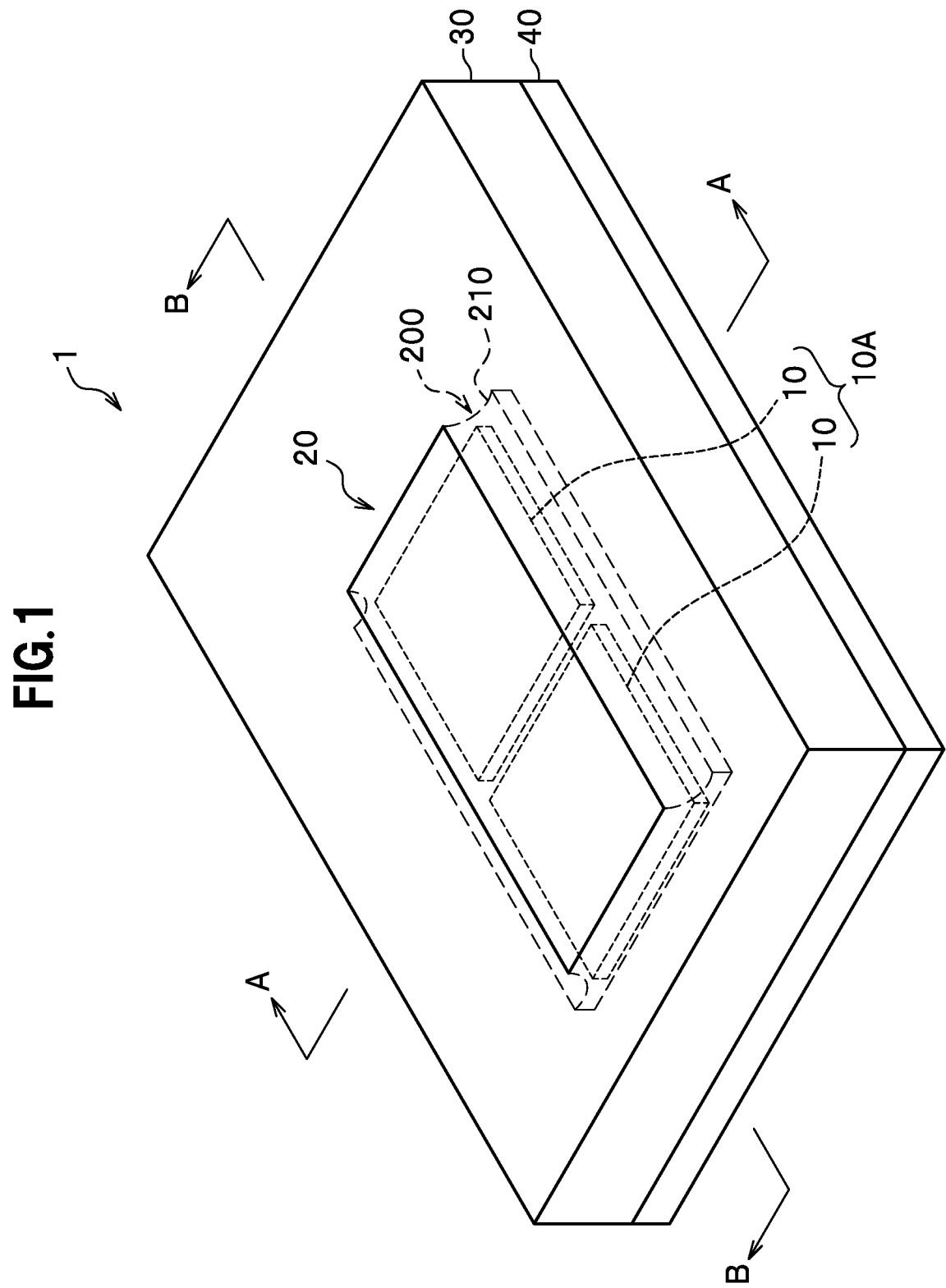
FIG. 1 is a perspective view schematically showing a light emitting device according to certain embodiment.

Hereinafter, a light emitting device according to an embodiment will be described with reference to the drawings. In the drawings to be referred to in the description below, the embodiment is schematically shown, and therefore the scales, intervals, positional relations and so on of the members may be exaggerated, or some of the members may be omitted. In the explanations given below, moreover, the same designations and reference numerals denote the components that are identical or of similar component, for which the explanations will be omitted when appropriate. Further, the directions shown in the drawings indicate relative positions between constituent elements, and are not intended to indicate absolute positions.

Configuration of Light Emitting Device

One example of a configuration of a light emitting device according to certain embodiment will be described with reference to FIGS. 1 to 3.

As shown in FIG. 1, a light emitting device 1 includes: a light emitting element 10 having an upper surface as a main light extraction surface; a light-transmissive member 20 which is bonded to the upper surface of the light emitting element 10, has a lower surface larger than the upper surface of the light emitting element 10 and an upper surface smaller than the lower surface, and allows light emitted from the light emitting element 10 to enter from the lower surface and exit outside from the upper surface of the light-transmissive member 20; a covering member 30 covering a lateral surfaces of the light-transmissive member 20 such that the upper surface of the light-transmissive member 20 is exposed; and a base member 40. In the light emitting device 1, the light-transmissive member 20 has at least one flange 200 on the lateral surface thereof. The flange 200 continues from a periphery of the upper surface to a periphery of the lower surface of the light-transmissive member 20 outside the upper surface of the light-transmissive member 20 and the upper surface of the light emitting element 10 in a top view. The flange 200 has a thin portion 210 inside the outer edge side of the flange 200. The thin portion has a thickness smaller than that of the flange 200 on the outer edge side (i.e. the outer edge of the light-transmissive member 20). Hereinafter, components of the light emitting device 1 will be described.

Light Emitting Element

As the light emitting element 10, a known light emitting element can be used, for example, a light emitting diode or a laser diode is preferably used. As the light emitting element 10, a light emitting element that emits light having a desired wavelength can be selected. For example, as a blue or green light emitting element, a light emitting element using a nitride-based semiconductor ($In_XAl_YGa_{1-X-Y}N$, $0 \leq X$, $0 \leq Y$, $X+Y \leq 1$) or GaP can be used. For a red light emitting element, not only a nitride-based semiconductor element but also GaAlAs, AlInGaP or the like can be used. As the light emitting element 10, a semiconductor light emitting element comprising a material other than the materials described above can also be used. The composition, emission color and size of the light emitting element 10, the number of light emitting elements 10, and the like can be appropriately selected according to a purpose. Preferably, the light emitting element 10 has a pair of positive and negative electrodes on the same surface side. This can make it possible to perform flip-chip mounting of the light emitting element 10 on a base member 40. In this case, a surface opposed to a surface on which a pair of electrodes is formed serves as a main light extraction surface of the light emitting element 10. When face-up mounting of the light emitting element 10 on the base member 40 is employed, the surface on which a pair of electrodes is formed serves as a main light extraction surface of the light emitting element 10. For example, the light emitting element 10 is electrically connected to the base member 40 through a bonding member such as a bump.

In this embodiment, the light emitting device 1 may include a light emitting element group 10A in which a plurality of light emitting elements 10 is arranged. In the light emitting element group 10A, for example, two light emitting elements 10 are orderly arranged on the base member 40 as shown in FIGS. 1 and 2B. When the light emitting device 1 includes the light emitting element group 10A, a lower surface 21 of the light-transmissive member 21 is formed in such a manner as to have an area larger than the area of an upper surface of the light emitting element group 10A. Preferably, a plurality of light emitting elements 10 included in the light emitting element group 10A is adjacently arranged in such a manner as to oppose their lateral surfaces to one another, and mounted in such a manner as to form a substantially rectangular shape in plan view as a whole. Here, in the light emitting element group 10A, the area of regions between adjacent light emitting elements 10 is a part of the area of the upper surfaces of the light emitting element group 10A. Preferably, an upper surface 22 of the light-transmissive member 20 is formed in such a manner as to have an area smaller than the area of the upper surface of the light emitting element group 10A. In the light emitting device 1 having such a configuration, light from a plurality of light emitting elements 10 can enter from the lower surface 21 of the light-transmissive member 20 and exit from the upper surface 22 of the light-transmissive member 20 which is smaller than the upper surface of the light emitting element group 10A, such that light can reach a long distance with a higher luminance.

Here, the light emitting element group 10A and the light-transmissive member 20 can be arranged closer to one side in one longitudinal direction of the light emitting device 1 as illustrated in FIG. 1, thus members such as Zener diode can be disposed.

Light-Transmissive Member

Figure 2A:
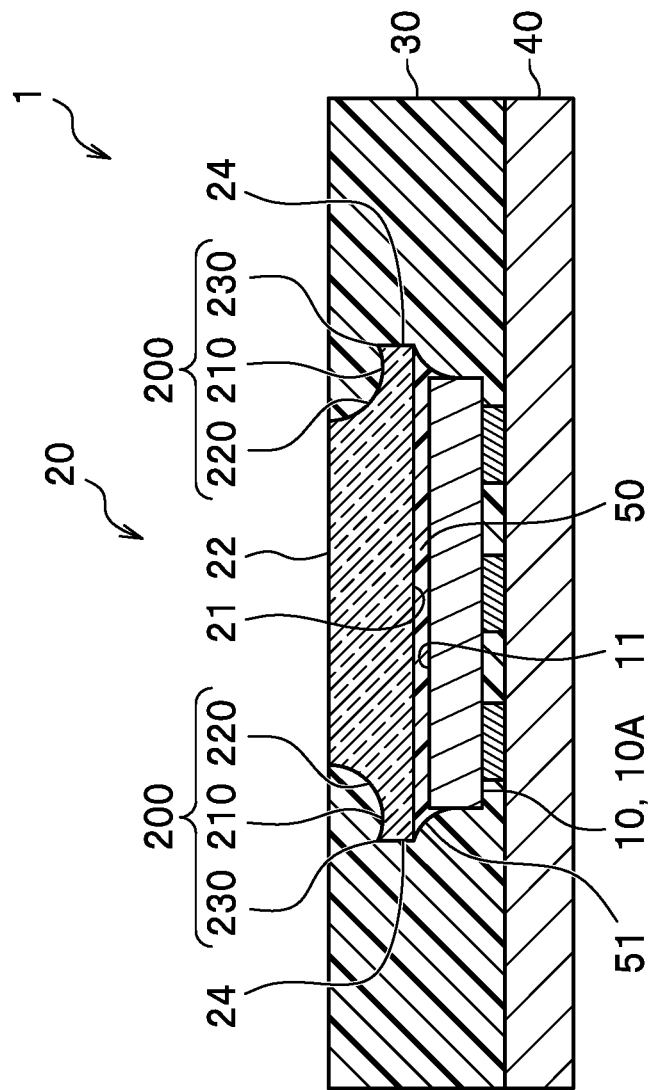
FIG. 2A is a sectional view taken along line A-A in the light emitting device in FIG. 1.
Figure 2B:
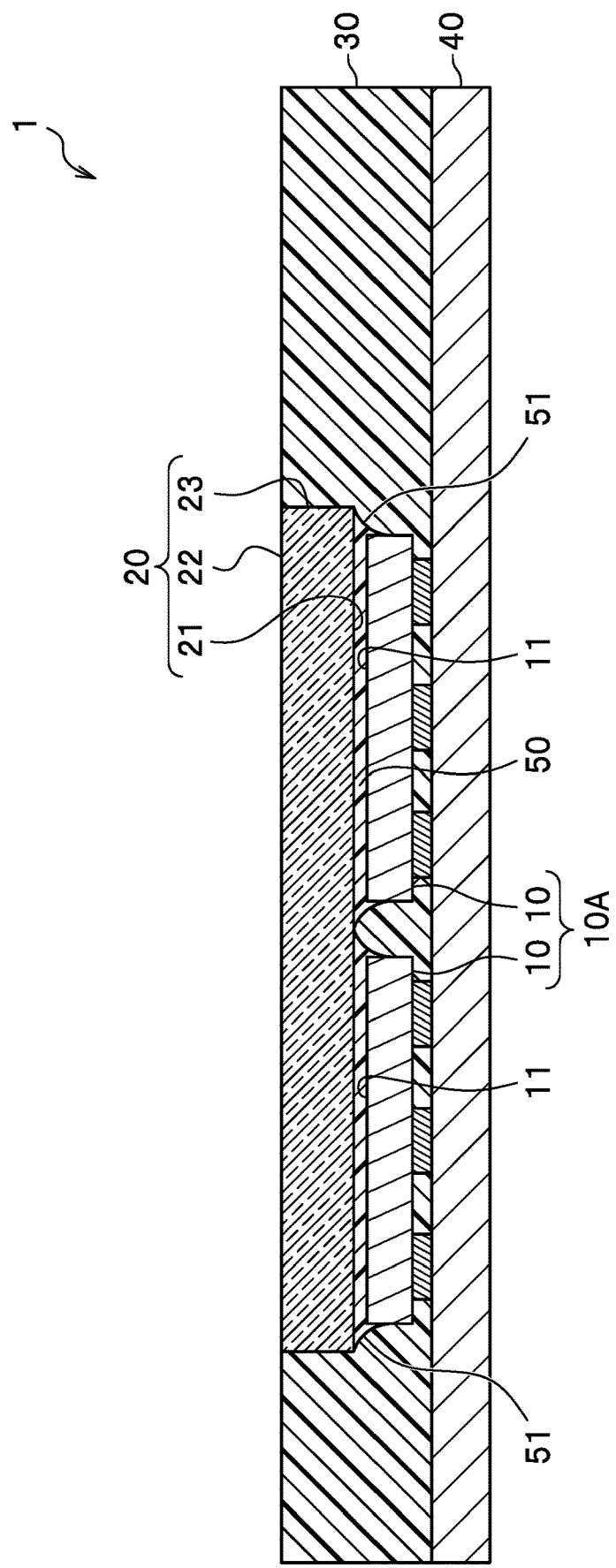
FIG. 2B is a sectional view taken along line B-B in the light emitting device in FIG. 1.

As shown in FIGS. 2A and 2B, the light-transmissive member 20 is bonded to an upper surface 11 of the light emitting element 10. The light-transmissive member 20 is formed in a single plate shape, and has a substantially rectangular shape in plan view. The light-transmissive member 20 has the lower surface 21 larger than the upper surface 11 of the light emitting element 10, the upper surface 22 larger than the lower surface 21, two first lateral surfaces 23 formed on short sides opposed to each other, and two second lateral surfaces 24 opposed to each other. Further, the light-transmissive member 20 has the flange 200 formed on at least one of the first lateral surface 23 and the second lateral surface 24. The flange 200 is continuously formed from a periphery of the upper surface to a periphery of the lower surface of the light-transmissive member 20 on at least a part of the lateral surfaces of the light-transmissive member 20. The light-transmissive member 20 allows light emitted from the light emitting element 10 to enter from the lower surface 21 and exit from the upper surface 22.

The lower surface 21 of the light-transmissive member 20 is a surface at which light from one or more light emitting elements 10 in the light emitting device 1 enters. The lower surface 21 of the light-transmissive member 20 is formed in such a manner as to have an area larger than the area of the upper surfaces of one or more light emitting elements 10 bonded to the lower surface 21 of the light-transmissive member 20. The lower surface 21 of the light-transmissive member 20 is substantially flat. The lower surface 21 of the light-transmissive member 20 is formed with an area larger than the area of the upper surfaces 11 of one or more light emitting elements 10 such that the light extraction surfaces of one or more light emitting elements 10 are wholly covered. Because the lower surface 21 of the light-transmissive member 20 is formed with an area larger than the area of the upper surfaces of one or more light emitting elements 10, light emitted from the light emitting element 10 can enter the light-transmissive member 20 without or with less loss.

The light emitting element 10 and the light-transmissive member 20 can be bonded to each other with, for example, an adhesive material 50. Preferably, the adhesive material 50 is interposed between the light emitting element 10 and the light-transmissive member 20, and disposed in such a manner as to cover at least a part of the lateral surfaces of the light emitting element 10. When the adhesive material 50 is used as a bonding member between the light emitting element 10 and the light-transmissive member 20, light emitted from the light emitting element 10 is propagated to the lower surface of the light-transmissive member 20 through the adhesive material 50. Thus, it is preferable that a member capable of effectively guiding light emitted from the light emitting element 10 to the light-transmissive member 20 is used for the adhesive material 50. As such a member having good light guide property and good adhesiveness, a well known resin material such as an epoxy resin or a silicone resin, an organic adhesive material having a high refractive index, an inorganic adhesive material, or the adhesive material 50 made of low-melting-point glass can be used.

Preferably, the lower surface 21 of the light-transmissive member 20 has such a size that the adhesive material 50 can be spread in a fillet shape on the lateral surfaces of the light emitting element 10 to form a fillet 51. In other words, it is preferable that the lower surface 21 of the light-transmissive member 20 has such a size that an end portion of the fillet 51 formed by the adhesive material 50 coincides with the end of the lower surface 21. Accordingly, light emitted from the lateral surfaces of the light emitting element 10 is propagated to the lower surface of the light-transmissive member 20 through the adhesive material 50. Further, because the lower surface 21 of the light-transmissive member 20 has an area larger than an area of the upper surface of the light emitting element 10, the upper surface 11 of the light emitting element 10 can be covered with the lower surface 21 of the light-transmissive member 20 even when slight positional displacement occurs at the time of bonding the light-transmissive member 20 and the light emitting element 10 to each other. The light-transmissive member 20 is formed such that the lower surface 21 and the upper surface 22 are substantially flat and parallel to each other. The two mutually opposed first lateral surfaces 23 of the light-transmissive member 20 are formed in such a manner as to be substantially perpendicularly connected to the upper surface 22 and the lower surface 21 thereof. Further, the flange 200 is formed on the two mutually opposed second lateral surfaces 24 of the light-transmissive member 20.

Light entering from the lower surface 21 exits from the upper surface 22 of the light-transmissive member 20 as a light emitting surface of the light emitting device 1. The upper surface 22 is formed in such a manner as to have an area smaller than the area of the lower surface 21. The light-transmissive member 20 is disposed such that the upper surface 22 is not covered with the covering member 30, but exposed from the covering member 30. The upper surface 22 is formed in such a manner as to be substantially flat. Preferably, the upper surface 22 and the lower surface 21 have substantially analogous shapes or similar shapes, and the upper surface 22 and the lower surface 21 of the light-transmissive member 20 are formed such that their centers of gravity overlap each other. This makes it possible to prevent or reduce luminance non-uniformity on the light emitting surface of the light emitting device 1 (i.e. the upper surface 22 of the light-transmissive member 20).

The area of the upper surface 22 of the light-transmissive member 20 is preferably smaller than the sum of the areas of the upper surfaces 11 of one or more light emitting elements 10 in the light emitting device 1. By reducing the area of the upper surface 22 of the light-transmissive member 20 as described above, light which is emitted the light emitting element 10 and enters from the lower surface 21 of the light-transmissive member 20 can exit from the upper surface 22 having a smaller area (i.e. light emitting surface of the light emitting device 1). That is, in the light emitting device 1, by virtue of light from the light emitting element 10 passes through the light-transmissive member 20, the area of the light emitting surface is reduced, so that light can reach a longer distance with a high luminance.

The first lateral surfaces 23 of the light-transmissive member 20 are formed in such a manner as to be substantially perpendicular to the lower surface 21 and the upper surface 22 of the light-transmissive member 20. This makes it possible to prevent or reduce creeping-up of the covering member 30 to the upper surface 22 at the time of manufacturing the light emitting device 1. The angle of the first lateral surfaces 23 with respect to, for example, the upper surface 22 are each set within a range of 90°±5° such that the creeping-up of the covering member 30 can be prevented or reduced. In this specification, an angle within this range corresponds to being substantially perpendicular. Because the first lateral surfaces 23 are formed in such a manner as to be substantially perpendicular to the upper surface 22, the first lateral surfaces 23 are positioned at a boundary between the light-emitting portion and the non-light-emitting portion in a top view when the upper surface 22 of the light-transmissive member 20 is a light emitting surface of the light emitting device 1. Accordingly, the light emitting device 1 can have a clear boundary between the light-emitting portion and the non-light-emitting portion.

The thickness of the light-transmissive member 20 is, in a range of, for example, about 50 to about 300 μm in terms of a thickness between the upper surface 22 and the lower surface 21.

Flange

Figure 3A:
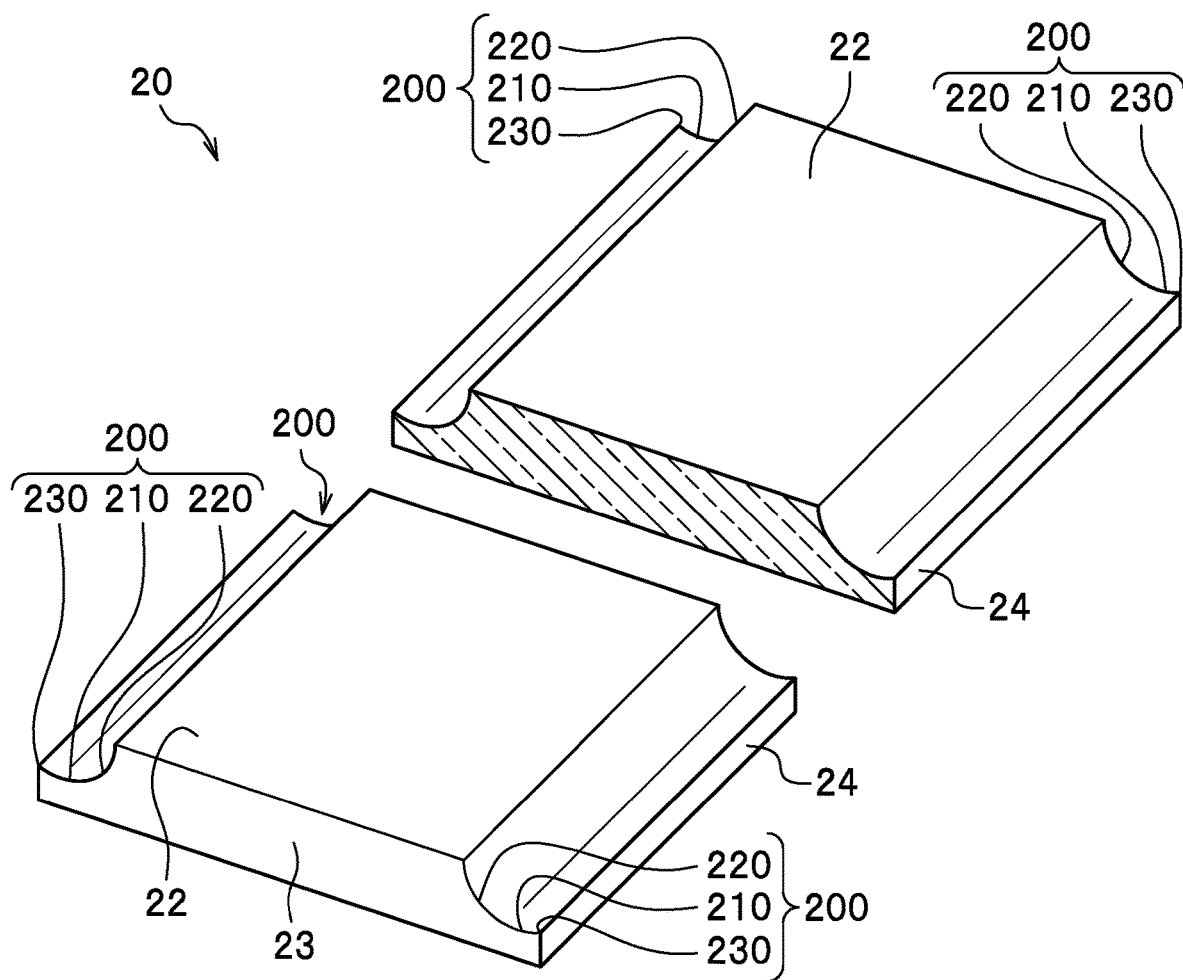
FIG. 3A is an explanatory diagram schematically showing a cut part of a light-transmissive member of the light emitting device according to the embodiment.
Figure 3B:
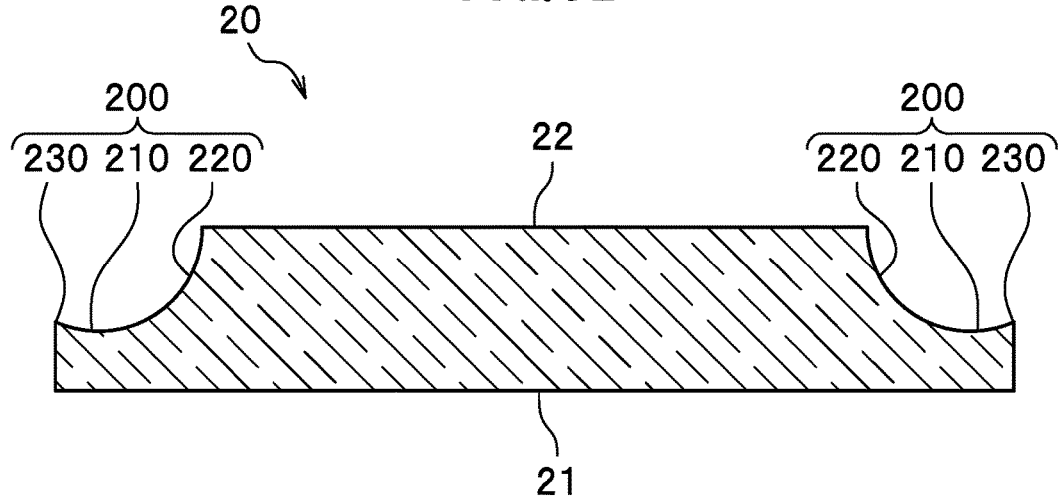
FIG. 3B is a sectional view along a short side of the light-transmissive member in FIG. 3A.

The flange 200 is formed in a ring shape on at least a part of the lateral surface of the light-transmissive member 20. In this embodiment, the flange 200 is formed on each of two mutually opposed second lateral surfaces 24 of the light-transmissive member 20 as shown in FIG. 3A. The flange 200 is formed in such a manner as to extrude laterally from the upper surface 22 of the light-transmissive member 20 in a top view. The flange 200 has an inclined surface 220 extending in an outward direction from the upper surface 22 to the lower surface 21 of the light-transmissive member 20. A lower surface of the flange 200 is identical to the lower surface 21 of the light-transmissive member 20.

The flange 200 has the thin portion 210. The thin portion 210 is a groove along the periphery of the upper surface 22 connected to the flange 200, and is formed inside an outer edge 230 of the flange 200 in plan view. The thin portion 210 is a portion which has the smallest thickness in the flange 200, in other words, a portion which is the deepest in the formed groove. By virtue of the thin portion 210 of the flange 200, the contact area between the later-described covering member 30 and the flange 200 is increased, so that adhesion between the covering member 30 and the flange 200 is improved. Also because the flange 200 has the thin portion 210, the thickness of the covering member 30 covering the flange 200 can be increased, so that leakage of light from the flange 200 to the light emitting surface side can be prevented or reduced. In particular, by having a portion closer to the top surface 22 on the thin portion 210 in plan view, the thickness of the covering member 30 can be partially increased in the vicinity of the upper surface 22 on a side where the flange 200 is present. Accordingly, a clarified boundary can be realized between the light emitting surface of the light emitting device 1 (i.e. the upper surface 22 of the light-transmissive member 20) and the upper surface of the covering member 30 surrounding the light emitting surface. Further, because the thin portion 210 is positioned away from the outer edge 230 of the light-transmissive member 20, chipping and breakage of the light-transmissive member 20 are less likely to occur during processing.

The width of the flange 200, i.e. the distance between the end of the upper surface 22 on the flange 200 side and the outer edge 230 in plan view is, for example, about 75 μm. In the case of the thickness of the light transmissive member 20 is 300 μm, for example, the thickness of the thin portion 210 is in a range of about 50 μm to 60 μm, and the thickness at the outer edge 230 is in a range of about 60 μm to 70 μm.

The flange 200 has the inclined surface 220 extending in an outward direction from the upper surface 22 to the lower surface 21 of the light-transmissive member 20.

The inclined surface 220 has a curved surface extending in the outward direction from the upper surface 22 of the light-transmissive member 20 to the thin portion 210. That is, the thickness of the flange 200 (i.e. height from the lower surface 21 of the light-transmissive member 20 to the upper surface of the flange 200) gently decreases from the outer edge 230 of the flange 200 toward the thin portion 210, and gently increases from the thin portion 210 toward the upper surface 22, such that the thin portion 210 is positioned inside the outer edge 230. The inclined surface 220 extending from the thin portion 210 to the upper surface 22 becomes sharper as positioning farther from the thin portion 210. The inclination angle of the flange 200 is substantially a right angle with respect to the upper surface 22 in the vicinity of a boundary between the flange 200 and the upper surface 22. Because the flange 200 has the inclined surface 220 having the thin portion 210 as described above, light from the light emitting element 10 can be efficiently reflected to the upper surface 22 of the light-transmissive member 20 with a reduced reflection frequency, so that the light emitting device 1 with a high luminance can be obtained. The inclined surface 220 of the flange 200 can alleviate stress concentration, to thereby improve the structural strength of the light-transmissive member 20.

The light-transmissive member 20 as well as the flange 200 is composed of a material capable of transmitting light emitted from the light emitting element 10, and extracting the light outside. The light-transmissive member 20 can be formed of material comprising, for example, a resin, glass, an inorganic substance or the like. The light-transmissive member 20 may contain a light diffusing agent, and a fluorescent material capable of wavelength conversion of at least a part of light entering from the light emitting element 10. The light-transmissive member 20 containing a fluorescent material is, for example, a fluorescent material sintered body, or a resin, glass, a ceramic, other inorganic substance or the like, respectively containing a fluorescent powder. The light-transmissive material 20 may be one in which a resin layer containing a fluorescent material is formed on the surface of a component formed of material comprising a resin, glass, a ceramic or the like. The sintered body of the fluorescent material may be one formed by sintering only a fluorescent material, or one formed by sintering a mixture of a fluorescent material and a sintering aid. When a mixture of a fluorescent material and a sintering aid is sintered, it is preferable to use an inorganic material such as silicon oxide, aluminum oxide or titanium oxide as the sintering aid. This makes it possible to prevent or reduce discoloration and deformation of the sintering aid by light and heat even though the light emitting element 10 is high-output.

As the fluorescent material, a fluorescent material that can be used in the art can be appropriately selected. As a fluorescent material that can be excited with a blue light emitting element or ultraviolet light emitting element, for example, a cerium-activated yttrium aluminum garnet-based fluorescent material (YAG:Ce) or the like can be used. By combining such fluorescent materials with a blue light emitting element or ultraviolet light emitting element, light emitting devices of various colors (e.g. white light emitting device) can be produced. For obtaining the light emitting device 1 capable of emitting white light, the light emitting device 1 is adjusted to emit white light by the type and concentration of a fluorescent material contained in the light-transmissive member 20. The concentration of the fluorescent material contained in the light-transmissive member 20 is in a range of, for example, 30 to 80% by mass.

Adhesive Material

The light emitting element 10 and the light-transmissive member 20 can be bonded to each other with the adhesive material 50. The adhesive material 50 is formed in such a manner as to continue from the upper surface of the light emitting element 10 to at least a part of the lateral surfaces, and is interposed between the covering member 30 and at least a part of the lateral surfaces of the light emitting element 10. The upper surface of the adhesive material 50 interposed between the covering member 30 and the lateral surfaces of the light emitting element 10 is in contact with the lower surface 21 of the light-transmissive member 20. Preferably, a light-transmissive material capable of guiding light emitted from the light emitting element 10 to the light-transmissive member 20 is used for the adhesive material 50. Examples of material for the adhesive material 50 include a known adhesive material such as an epoxy resin or a silicone resin, an organic adhesive material having a high refractive index, an inorganic adhesive material, an adhesive material comprising low-melting-point glass or the like. Preferably, the adhesive material 50 extends from the upper surface to the lateral surfaces of the light emitting element 10, and is provided as a fillet 51. Preferably, the fillet 51 is in contact with both the lower surface 21 of the light-transmissive member 20 and the lateral surfaces of the light emitting element 10, and has a curved surface being concave to the covering member 30 side. With this shape, light emitted from the light emitting element 10 is reflected by the fillet surface of the adhesive material 50, and thus easily guided to the light-transmissive member 20.

The light-transmissive member 20 and the light emitting element 10 may be directly bonded to each other by pressure bonding, sintering, surface activation bonding, atomic diffusion bonding, hydroxyl group bonding or the like instead of using the adhesive material 50.

Covering Member

The covering member 30 can be formed of a member capable of reflecting light from the light emitting element 10. The covering member 30 is provided in such a manner that the upper surface 22 of the light-transmissive member 20 is exposed as a light emitting surface of the light emitting device 1. The covering member 30 may covers at least a part of the flange 200, the light-transmissive member 20, the light emitting element 10, and the upper surface of the base member 40. Specifically, the covering member 30 is provided in such a manner as to cover the inclined surface 220 and the lateral surfaces of the flange 200, the first lateral surfaces 23 of the light-transmissive member 20, the lateral surfaces of the adhesive material 50, the lateral surfaces and the lower surface of the light emitting element 10, and a part of the upper surface of the base member 40. Thus, light emitted from the light emitting element 10 enters the light-transmissive member 20 directly or after being reflected by the covering member 30, passes through the inside of light-transmissive member 20, and exits from the upper surface 22 of the light-transmissive member 20 serving as the light emitting surface of the light emitting device 1.

Here, the height of the upper surface of the covering member 30 is preferably equivalent to the height of the upper surface 22 of the light-transmissive member 20, or lower than the height of the upper surface 22 of the light-transmissive member 20. Light emitted from the upper surface 22 of the light-transmissive member 20 as a light emitting surface of the light emitting device 1 also extends in a lateral direction. Thus, when the upper surface of the covering member 30 is positioned higher than the upper surface 22 of the light-transmissive member 20, light emitted from the upper surface 22 of the light-transmissive member 20 hits on the upper surface of the covering member 30 to be reflected, leading to occurrence of uneven light distribution. Thus, the height of the upper surface of the covering member 30 is preferably equivalent to or lower than the upper surface 22 of the light-transmissive member 20 because light emitted from the light emitting element 10 can be efficiently extracted outside.

The covering member 30 can be formed by adding a light reflecting substance to a base material comprising a silicone resin, a modified silicone resin, an epoxy resin, a modified epoxy resin, an acrylic resin, or a hybrid resin containing at least one of these resins. Examples of the light reflecting substance include titanium oxide, silicon oxide, zirconium oxide, yttrium oxide, yttria-stabilized zirconia, potassium titanate, alumina, aluminum nitride, boron nitride, mullite or the like. Because amount of light reflection and amount of transmission of the covering member 30 vary depending on the concentration and the density of the light reflecting substance, the concentration and the density should be adjusted according to the shape and size of the light emitting device 1. A material having heat dissipation in addition to light-reflectivity is used as the covering member 30, heat dissipation can be improved while light-reflectivity is imparted. Examples of the material include aluminum nitride and boron nitride which have a thermal conductivity.

Base Member

The base member 40 has at least one light emitting element 10 mounted thereon, and electrically connects the light emitting device 1 to the outside. The base member 40 includes a flat plate-shaped support member, and a conductive wiring on a surface of the support member and/or inside the support member. Structures of the base member 40, such as the shape and size of the conductive wiring, are determined according to the configuration and size of the electrode of the light emitting element 10. The lower surface of the base member 40 may include a heat dissipating terminal electrically independent of the light emitting element 10. Preferably, the heat dissipating terminal is formed in such a manner as to have an area larger than the sum of the areas of the upper surfaces of all light emitting elements 10 in the light emitting device 1, and disposed in such a manner as to overlap a region immediately below the light emitting element 10 in a top view. The configuration of the heat dissipating terminal can make the light emitting device 1 with good heat dissipation.

For the support member of the base member 40, it is preferable to use an insulating material, and to use a material that hardly transmits light emitted from the light emitting element 10, external light, and the like. For the base member 40, it is preferable to use a material having a certain degree of strength. Specific examples of the material include: ceramics such as alumina, aluminum nitride and mullite; and resins such as phenol resin, epoxy resin, polyimide resin, bismaleimide-triazine resin (BT resin) and polyphthalamide (PPA). The support member may have a cavity. This makes it possible to easily form the covering member 30 by, for example, dropping the material of the covering member 30.

The conductive wiring and the heat dissipating terminal can be formed using, for example, a metal such as Cu, Ag, Au, Al, Pt, Ti, W, Pd, Fe or Ni, or an alloy of any of these metals. The conductive wiring can be formed by electroplating, electroless plating, vapor deposition, sputtering or the like.

The light emitting device 1 has the configuration described above, and therefore as one example, when the light emitting device 1 is used for a headlight of a motorcycle or automobile, or a lighting of a watercraft or aircraft, light emitted from the light emitting element 10 can reach a greater distance. That is, in the light emitting device 1, light emitted from one or more light emitting elements 10 include: light which is not reflected by the covering member 30, but propagated through the inside of the light-transmissive member 20 to the upper surface 22 of the light-transmissive member 20 directly; and light which is reflected by the covering member 30, and exits from the upper surface 22 of the light-transmissive member 20. In the light emitting device 1, the area of the lower surface 21 of the light-transmissive member 20 is larger than the sum of the areas of the upper surfaces of the light emitting elements 10, so that light emitted from the light emitting element 11 can be received without or with less loss. Further, the area of the upper surface 22 of the light-transmissive member 20 is smaller than the area of the lower surface 21 of the light-transmissive member 20. Thus, light emitted from the light emitting element 10 is accumulated on the upper surface 22 of the light-transmissive member 20. This makes it possible to obtain the light emitting device 1 which is suitable for use in high beam of headlight applications, and can emit light reaching a longer distance with a high luminance.

Further, in the light emitting device 1, the thin portion 210 on the flange 200 can increase the contact area between the covering member 30 and the flange 200, thereby leading to improvement of adhesion therebetween. In addition, the thickness of the covering member 30 covering the thin portion 210 increases, and therefore leakage of light from the upper surface of the covering member 30 can be prevented or reduced. Further, in the light emitting device 1, the thin portion 210 is positioned away from the outer edge 230 of the light-transmissive member 20, so that occurrence of chipping and breakage of the light-transmissive member 20 is prevented or reduced.

Method of Manufacturing Light Emitting Device

Figure 4:
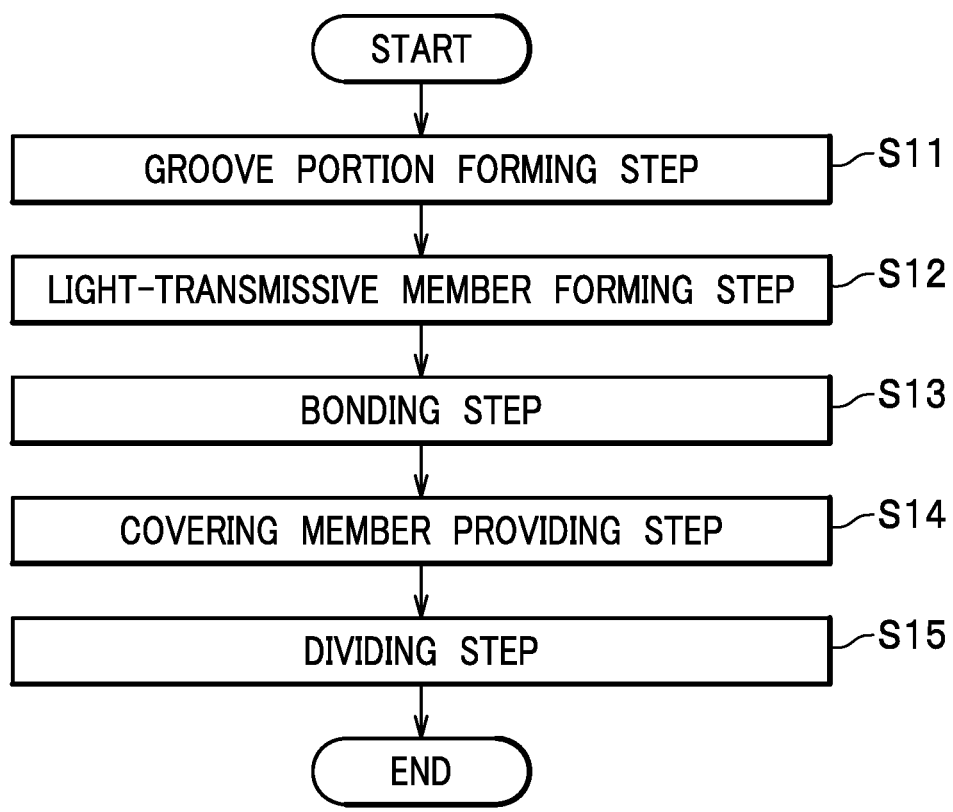
FIG. 4 is a flow chart showing a method of manufacturing a light emitting device according to the embodiment.
Figure 5A:
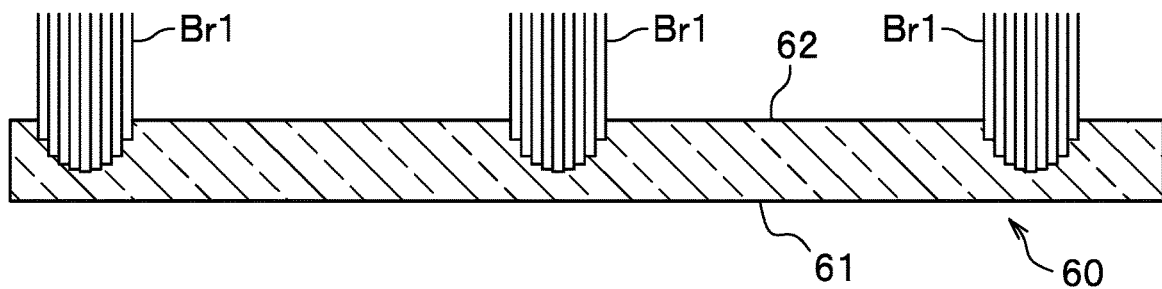
FIG. 5A is an explanatory diagram schematically showing an initial state of formation of groove portions on an upper surface of a light-transmissive substrate in the method of manufacturing a light emitting device according to the embodiment.
Figure 5B:
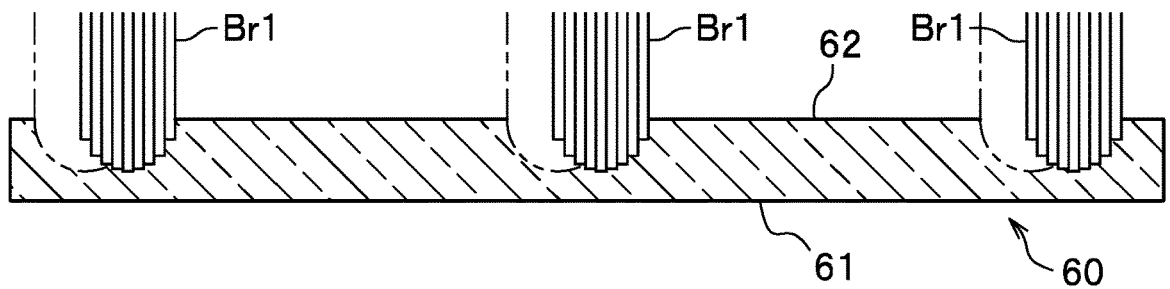
FIG. 5B is an explanatory diagram schematically showing a process of forming groove portions on the upper surface of the light-transmissive substrate in the method of manufacturing a light emitting device according to the embodiment.
Figure 5C:
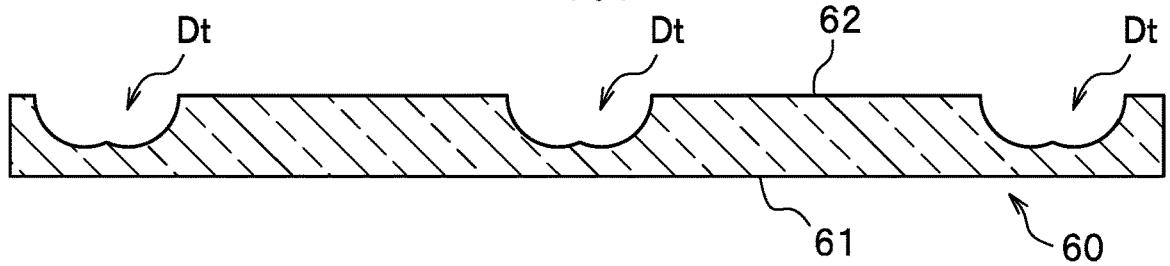
FIG. 5C is an explanatory diagram schematically showing the groove portions formed on the upper surface of the light-transmissive substrate in the method of manufacturing a light emitting device according to the embodiment.
Figure 5D:
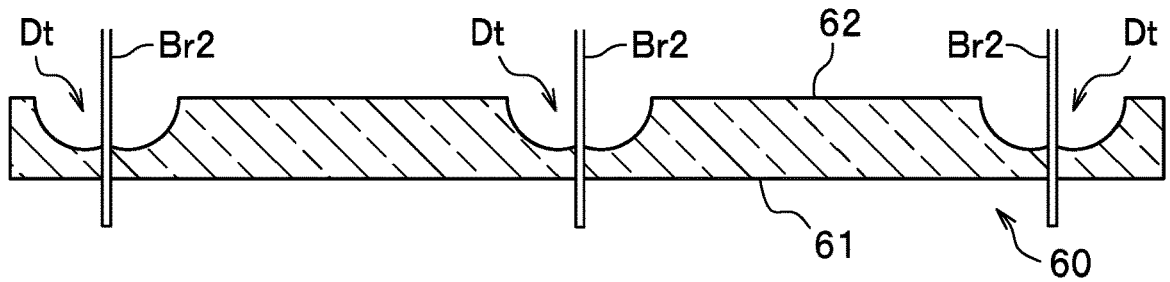
FIG. 5D is an explanatory diagram schematically showing a state in which a light-transmissive member substrate is divided along the shorter side at the groove portions in the method of manufacturing a light emitting device according to the embodiment.
Figure 5E:
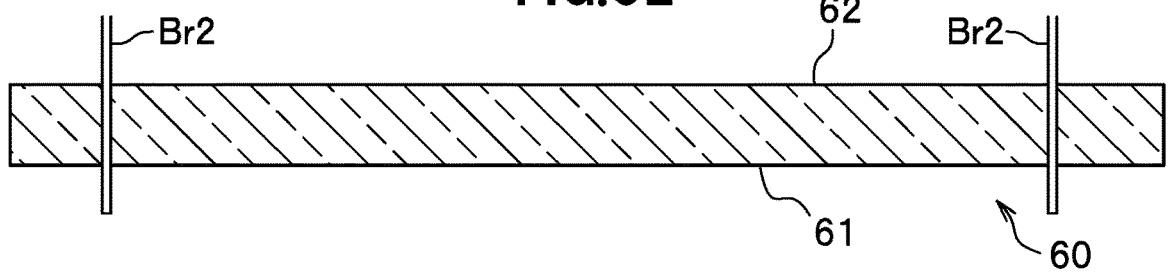
FIG. 5E is an explanatory diagram schematically showing a state in which the upper surface of the light-transmissive substrate is divided along a longer side in the method of manufacturing a light emitting device according to the embodiment.

A method of manufacturing the light emitting device 1 shown in the flowchart of FIG. 4 will be described with reference to FIGS. 5A to 5I. FIG. 5E shows a cross-section along the long side of the light-transmissive member 20, and FIGS. 5A to 5D and 5F to 5I show a cross-section along the short direction of the light-transmissive member 20.

Providing Light-Transmissive Substrate

A light-transmissive substrate 60 is provided. The light-transmissive substrate 60 may be provided before a groove portion forming step.

The light-transmissive substrate 60 is formed of a material capable of transmitting light emitted from the light emitting element 10, and allowing the light to exit outside. The light-transmissive substrate 60 may contain a fluorescent material which converts wavelength of a part of light from the light emitting element 10. The light-transmissive substrate 60 may be one obtained by forming a fluorescent material-containing resin layer on the surface of a component formed of material comprising a resin, glass, a ceramic or the like. As a method of forming a fluorescent material-containing resin layer, a printing method, a compression molding method, a fluorescent material electrodeposition method, a method using fluorescent material sheet, or the like can be used. The light-transmissive substrate 60 is formed as the light-transmissive member 20 having the flange 200 by passing through steps in FIGS. 5A to 5I. A lower surface 61 of the light-transmissive substrate 60 is to be the lower substrate 21 of the light-transmissive member 20, and an upper surface 62 of the light-transmissive substrate 60 is to be the upper surface 22 of the light-transmissive member 20.

Forming Groove Portion

A groove portion forming step is a step of forming groove portions Dt on the upper surface 62 of the light-transmissive substrate 60 using a blade Br1 of a processing machine or the like.

In this embodiment, the groove portions Dt are formed by cutting the light-transmissive substrate 60 twice at different positions by the blade Br1. For example, first cutting is performed by the blade Br1 as shown in FIG. 5A, and the insertion position of the blade Br1 is changed, and second cutting is performed, as shown in FIG. 5B. The cutting depths in the first cutting and the second cutting can be equal to each other, and the interval between the insertion positions of the blade Br1 in the first cutting and the second cutting is equal to or less than the blade thickness of the blade Br1. Accordingly, the central portion of the groove portion Dt can be made thick as shown in FIG. 5C. The groove portion Dt have a depth that does not penetrate through the light-transmissive substrate 60. The groove portion Dt formed in the groove portion forming step defines the thin portion 210 and the inclined portion 220 of the flange 200. In the groove portion forming step, it is preferable to perform processing such that the upper surface 62 of the light-transmissive substrate 60 has a rectangular shape having an area smaller than sum of the areas of the upper surface(s) 11 of the one or more light emitting elements 10 by virtue of the groove portions Dt.

In this embodiment, only a pair of mutually opposed lateral surfaces of the light-transmissive member 20 form the flange 200, and therefore the groove portions Dt may be formed such as each of the light-transmissive members 20 have the groove portions Dt in only one direction.

The groove portions Dt may be formed by other known methods, for example, laser processing. In addition, the groove portion Dt having an inclined surface may be formed using a blade for forming bevel cut. The groove portion Dt is shown as a curved line in sectional view, but may be formed as a straight line.

Forming Light-Transmissive Member

A light-transmissive member forming step is a step of obtaining the light-transmissive member 20 by dividing the light-transmissive substrate 60. In a direction where the groove portions Dt is present in the light-transmissive substrate 60, the light-transmissive substrate 60 is divided at a position including the groove portion Dt in the light-transmissive substrate 60 as shown in FIG. 5D. Here, a substantially central portion of the groove portion Dt, in other words, a portion having the largest thickness within the groove portion Dt is cut. In a direction where the groove portion Dt is not present in the light-transmissive substrate 60, the light-transmissive substrate 60 is divided at appropriate position according to the size of the light-transmissive member 20 as shown in FIG. 5E. In the light-transmissive member forming step, the light-transmissive substrate 60 is cut in such a manner as to be divided into light-transmissive members 20 using, for example, a blade Br2 having a blade thickness smaller than that of the blade Br1 used for forming the groove portions Dr. In the light-transmissive member forming step, a plurality of light-transmissive members 20 is obtained in which the lower surface 21 has an area larger than an area of the upper surface 22 of the light-transmissive member 20 as shown in FIG. 5F. The resulting light-transmissive member 20 has the thin portion 210 that has a thickness smaller than the thickness of the outer edge 230 is formed inside the outer edge 230 of the flange 200.

Providing Base Member and Light Emitting Element

The light emitting elements 10 and the base member 40 are each provided. The light emitting elements 10 and the base member 40 may be provided before a light-transmissive member 20 bonding step.

The base member 40 is formed in a flat plate shape which is rectangular in plan view, and for example, a conductive wiring and a heat dissipating terminal are provided on a support member.

The light emitting elements 10 are mounted on the base member 40. In the light emitting device of the present embodiment, one or more of the light emitting elements 10 are mounted on the conductive wiring of the base member 40 with a bonding member, such as a bump BP, interposed therebetween.

Bonding Light-Transmissive Member

A light-transmissive member bonding step is a step of bonding the light-transmissive member 20 to the light emitting element 10. In the light-transmissive member bonding step, the lower surface 21 of the light-transmissive member 20 and the upper surface 11 of the light transmitting element 10 are bonded to each other in such a manner that the periphery of the lower surface 21 of the light-transmissive member 20 is positioned outside the periphery of the upper surface(s) 11 of the one or more light emitting elements 10 as shown in FIG. 5G.

The light emitting element 10 and the light-transmissive member 20 can be bonded with, for example, the adhesive material 50. In bonding with the adhesive material 50, first the adhesive material 50 is dropped to the upper surface 11 of the light emitting element 10, and the light-transmissive member 20 is disposed on the adhesive material 50. The dropped adhesive material 50 is pressed by the light-transmissive member 20 to wet and spread to the lateral surface of the light emitting element 10, so that the fillet 51 is formed between the lower surface 21 of the light-transmissive member 20 and the lateral surface of the light emitting element 10. The amount and the viscosity of the adhesive material 50 to be dropped are appropriately adjusted such that the fillet 51 is provided on the lateral surface of the light emitting element 10, and the adhesive material 50 does not wet and spread to the base member 40.

Preferably, the light-transmissive member 20 is formed such that the area of the lower surface 21 of the light-transmissive member 20 is larger than the sum of the areas of the upper surfaces 11 of one or more light emitting elements 10. Preferably, the light-transmissive member 20 is disposed such that the distances from the individual lateral surfaces of the light emitting elements 10 to the outer edge of the lower surface 21 of the light-transmissive member 20 are substantially equivalent after bonding the light-transmissive member 20 and the light emitting element 10 to each other. Preferably, the light-transmissive member 20 is disposed such that the center of the upper surface 22 of the light-transmissive member 20 substantially overlaps the center of the whole of one or more light emitting elements 10 orderly arranged in such a manner as to form a rectangular shape in plan view as a whole. In the light-transmissive member 20 bonded to the light emitting elements 10, the area of the lower surface 21 of the light-transmissive member 20 is larger than the sum of the areas of the upper surface(s) 11 of the one or more light emitting elements 10. Thus, the light-transmissive member 20 has such a configuration that light from the upper surface of the light emitting element 10 enters from the lower surface 21 of the light-transmissive member 20, which has an area larger than area of the upper surface(s) 11 of the one or more light emitting elements 10, and guided to the upper surface 22 of the light-transmissive member 20, which has an area smaller than the area of the lower surface 21 of the light-transmissive member 20 and smaller than the area of the upper surface(s) 11 of the one or more light emitting elements 10.

Providing Covering Member

A covering member providing step is a step of providing the covering member 30 covering the one or more light emitting elements 10, the light-transmissive member 20 and the base member 40 as shown in FIG. 5H. In the covering member providing step, the light emitting device 1 may have one or more kinds of covering members 30. In the example below, the covering member 30 is formed with two layers, but in the covering member providing step, one kind of covering member 30 may be provided.

Providing First Covering Member

The covering member 30 is provided between the light emitting element 10 and the base member 40, and up to a height at which the light emitting element 10 and the adhesive material 50 on its lateral surfaces are covered. Preferably, a material having a low linear expansion coefficient is used for the covering member 30 when the covering member 30 is disposed between the light emitting element 10 and the base member 40. This makes it possible to reduce thermal stress exerted at a bonding portion between the light emitting element 10 and the base member 40.

Providing Second Covering Member

Subsequently, the covering member 30 covering the flange 200 is provided. The covering member 30 covers the flange 200 and the first lateral surfaces 23 of the light-transmissive member 20. Here, it is preferable to drop the covering member 30 to the upper surface of the base member 40 farther from the light-transmissive member 20 such that the upper surface 22 of the light-transmissive member 20 is exposed from the covering member 30. The covering member 30 is provided in such a manner as to cover the surface of the previously provided covering member 30. The covering member 30 to be used in the second covering member providing step is, for example, a silicone resin which contains titanium oxide.

Dividing

The dividing step is a step of dividing the workpiece into individual light emitting devices 1 provided on the base member 40. The dividing step is performed after formation of the covering member 30 by cutting the base member 40 and the covering member 30 into the individual the light emitting devices 1 by laser irradiation or a tool such as a blade to form light emitting devices 1 as shown in FIG. 5I. In the light emitting device 1 manufactured through the above-described steps, light emitted from one or more light emitting elements 10 can enter from the lower surface 21 of the light-transmissive member 20, which has an area larger than the sum of the areas of the upper surfaces of one or more light emitting elements 10, and exit outside as high luminance light from the upper surface 22 of the light-transmissive member 20, which has an area smaller than that of the lower surface 21 of the light-transmissive member 20.

The method for manufacturing the light emitting device 1 includes the above-described steps, and is capable of manufacturing the light emitting device 1 which emits light with a higher luminance. The flange 200 is provided with the thin portion 210, and therefore in the covering member providing step, the covering member 30 is easily retained at the flange 200, so that covering with the covering member 30 can be facilitated by an anchoring effect. Further, the flange 200 is formed on only two lateral surfaces opposed to the light-transmissive member 20, and therefore as compared to a case where the flange 200 is formed on an entire perimeter of the light-transmissive member 20, an uncured resin material that forms the covering member 30 easily flows onto the flange 200 in the covering member providing step, so that generation of voids can be prevented or reduced.

The embodiment according to the present disclosure has been described above in detail, but the present disclosure is not limited to the foregoing embodiment, and includes design changes etc. without departing from the scope of the present disclosure. Further, as one example, the light emitting device may have a configuration as described below.

Modification 1

A light emitting device 1A may include only one light emitting element 10 as shown in FIG. 6. A light-transmissive member 20 is formed such that a lower surface 21 of the light-transmissive member 20 is larger than a region of one light emitting element 10, and an upper surface 22 of the light-transmissive member 20 is smaller than the lower surface 21. In the light emitting device 1A having such a configuration, light from the light emitting element 10 can enter from the lower surface 21 of the light-transmissive member 20, and exit outside from the upper surface 22 smaller than the lower surface 21 of the light-transmissive member 20, so that light can reach a greater distance with a higher luminance.

Modification 2

A light emitting device 1B may include a light emitting element group 10B in which six light emitting elements 10 are orderly arranged as shown in FIG. 7. A light-transmissive member 20 is formed such that a lower surface 21 of the light-transmissive member 20 is larger than a region of the light emitting element group 10B, which is an area equal to the total area of six light emitting elements 10 arranged side by side, and an upper surface 22 of the light-transmissive member 20 is smaller than the lower surface 21 thereof. The area of the light emitting element group 10B includes the area of regions between adjacent light emitting elements 10 as a part of the area of the upper surface of the light emitting element group 10B. In the light emitting device 1B having such a configuration, light from the light emitting element 10 can enter from the lower surface 21 of the light-transmissive member 20, and exit outside from the upper surface 22 smaller than the lower surface 21 of the light-transmissive member 20, so that light can reach a greater distance with a higher luminance.

Modification 3

Figure 8:
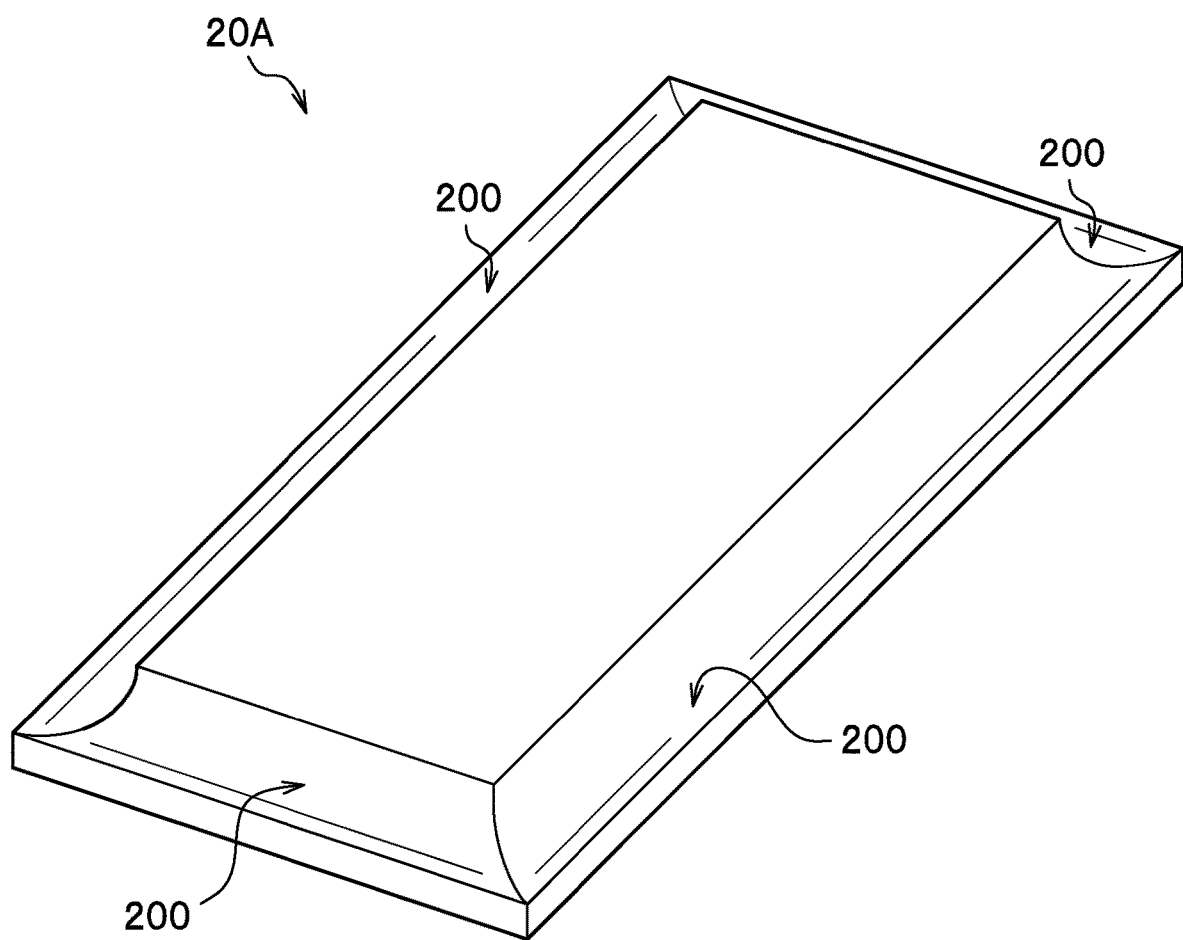
FIG. 8 is an explanatory diagram schematically showing a light-transmissive member of a light transmitting device in Modification 3.

A light-transmissive member 20A may have flanges 200 formed on an entire perimeter of the light-transmissive member 20A as shown in FIG. 8. The light-transmissive member 20A has a rectangular shape in a top view, and the flanges 200 is formed on all of the four sides of the rectangular shape of the light-transmissive member 20A. With this structure, the light emitting device 1B is prevented or reduced a possibility of light leakage at the entire perimeter of the light-transmissive member 20A, and can emits light with a higher luminance.

The number of flange may be one formed on at least one side of the rectangular shape in plan view in the light-transmissive member. Further, the flange may be formed on any other lateral surface. For example, the flanges may be formed on two opposed lateral surfaces, two continuous lateral surfaces, three continuous lateral surfaces or the like of the light-transmissive member having a rectangular shape in plan view.

Modification 4

A light-transmissive member 20B may include a first light-transmissive member 2 and a second light-transmissive member 3 as shown in FIG. 9. The first light-transmissive member 2 and the second light-transmissive member 3 each have an upper surface and a lower surface. The light-transmissive member 20B is obtained by bonding the upper surface of the first light-transmissive member 2 and the lower surface of the second light-transmissive member 3 to each other, and forming flanges 200 on the second light-transmissive member 3. The first light-transmissive member 2 is, for example, a resin layer containing a fluorescent material, and the second light-transmissive member 3 is a glass plate or a resin body. The second light-transmissive member 3 serves as a support for the first light-transmissive member 2. The light-transmissive member 20B is formed in a convex shape in which the upper surface of the second light-transmissive member 3 has an area smaller than an area of the lower surface of the first light-transmissive member 2, and a lateral end surface of the first light-transmissive member 2 is identical to a lateral end surface of the second light-transmissive member 3 in plan view.

The thickness of the second light-transmissive member 3 is preferably equal to or larger than the thickness of the first light-transmissive member 2. For example, the thickness of the second light-transmissive member 3 is in a range of about 30 µm to 270 µm. When the second light-transmissive member 3 is formed of material comprising a glass material, examples of the glass material include borosilicate glass. An AR (anti reflection) coating for preventing or reducing reflection may be applied on an upper surface and/or a lower surface of the glass material to be used. The second light-transmissive member 3 is one having a refractive index similar to a refractive index of the first light-transmissive member 2.

It is possible to thinly form the fluorescent layer (i.e. reduce the second light-transmissive member 3) while increasing the concentration of the fluorescent material contained in the first light-transmissive member 2.

When the first light-transmissive member 2 is formed of material comprising a resin material, the first light-transmissive member 2 is more flexible than the second light-transmissive member 3 formed of material comprising a glass material, and is less likely to be damaged even when the thickness is reduced. Thus, even when the area of the upper surface of the first light-transmissive member 2 is larger than the area of the lower surface of the second light-transmissive member 3, damage such as breakage or chipping of the second light-transmissive member 3 during manufacturing or use can be prevented or reduced.

When the second light-transmissive member 3 is formed of an inorganic material such as glass, the light emitting surface is less likely to degrade even in the case of long-term use.

Modification 5

A light-transmissive member 20C may have a flange 200C provided with a plurality of grooves as shown in FIG. 10. The flange 200C has two thin portions 210a and 210b inside an outer edge 230 in such a manner as to provide irregularities on an inclined surface 220. In sectional view of the flange 200C, the two thin portions 210a and 210b form recessed portions, and a projected portion lies between the two thin portions 210a and 210b. The two thin portions 210a and 210b have substantially the same shape and substantially the same depth. With such a configuration, adhesion between a covering member and the flange 200C is improved. An uncured resin material for forming the covering member easily flows along the groove during manufacturing.

The thin portions 210 may have different shapes and depths, and three or more thin portions 210 may be formed along the outer edge of the flange 200.

Modification 6

Figure 11:
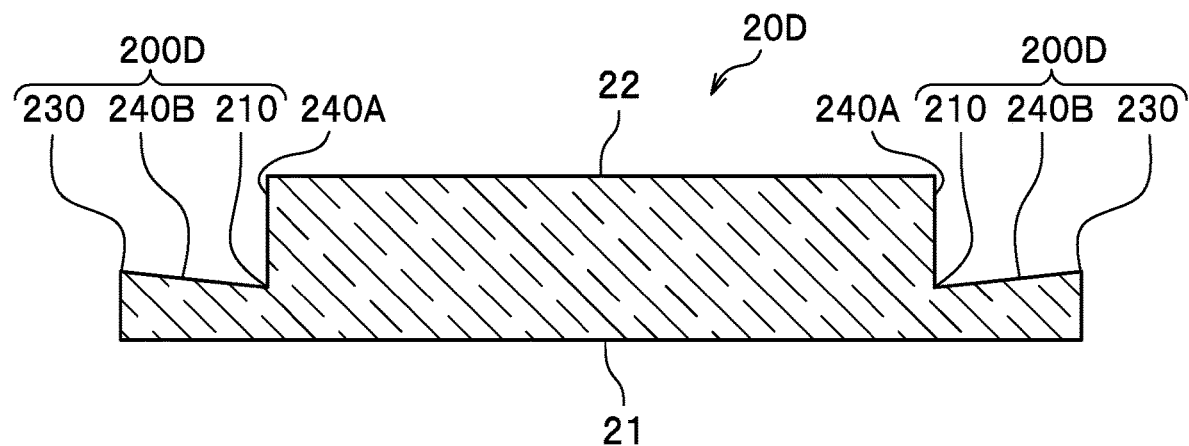
FIG. 11 is a sectional view of a light-transmissive member of a light emitting device in Modification 6.

A light-transmissive member 20D may have a flat inclined surfaced flange 200D as shown in FIG. 11. The flange 200D extends from a lateral surface 240A perpendicular to an upper surface 22, and has a flat inclined surface 240B downwardly inclined toward inside an outer edge 230. The connection portion between the lateral surface 240A and the upper surface 22 defines a right angle. Because the flat inclined surface 240B is gently inclined toward inside, the connection portion between the lateral surface 240A and the flat inclined surface 240B forms an angle of less than 90°. Therefore, the inner side of the flange 200D has a thickness smaller than the thickness of the outer edge 230 thereof, and the connection portion between the lateral surface 240A and the flat inclined surface 240B is a thin portion 210. Such a configuration can make clear border line between the thin portion 210 substantially overlap with a periphery of the upper surface 22, thereby enabling a clearer boundary between a light emitting surface of a light emitting device 1 (i.e. the upper surface 22 of a light-transmissive member 20) and an upper surface of a covering member 30 surrounding an outer periphery of the light emitting surface.

Modification 7

Figure 12:
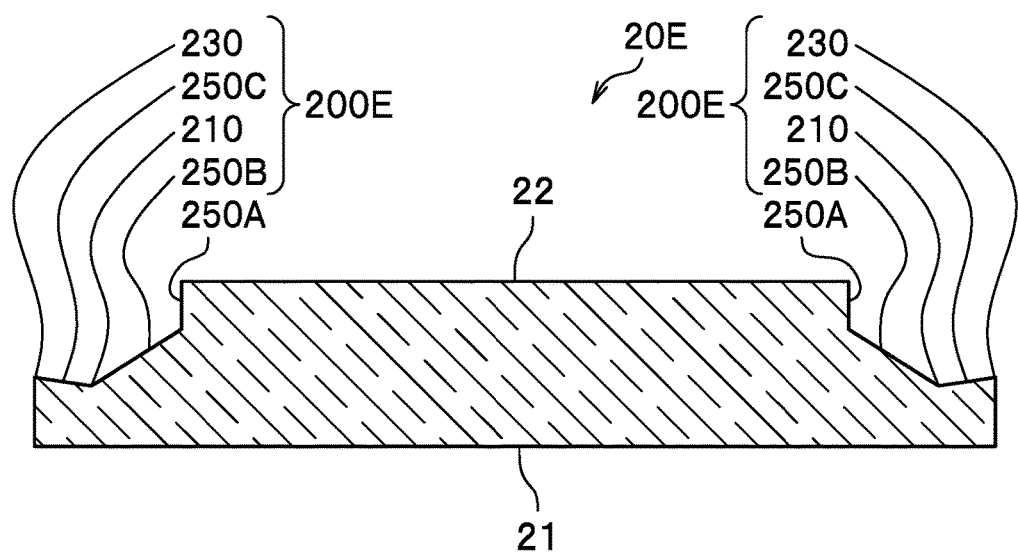
FIG. 12 is a sectional view of a light-transmissive member of a light emitting device in Modification 7.

A light-transmissive member 20E may have a flange 200E having a plurality of inclined surfaces as shown in FIG. 12. The flange 200E extends from a lateral surface 250A perpendicular to an upper surface 22, and has a flat inclined surface 250C downwardly inclined toward inside an outer edge 230, and an inclined surface 250B continuing to the lateral surface 250A and the flat inclined surface 250C. The connection portion between the lateral surface 250A and the upper surface 22 forms a right angle. The inclined surface 250B is formed in such a manner as to be inclined at an angle in a range of 10° to 60° with respect to the upper surface 22. Therefore, the inner side of the flange 200E has a thickness smaller than the thickness of the outer edge 230 thereof, and the connection portion between the inclined surface 250B and the flat inclined surface 250C is a thin portion 210. With such a configuration, leakage of light to the light emitting surface side from the flange 200E can be prevented or reduced.

The light emitting device according to the present disclosure can be used as a light source for a headlight of a vehicle such as a motorcycle or an automobile, or a transport such as a watercraft or an aircraft. In addition, the light emitting device can be used for various light sources such as light sources for various lightings such as spotlights, light sources for displays, and in-vehicle components.

What is claimed is:

1. A light emitting device comprising:
   a light emitting element having an upper surface serving as a light extraction surface, a lower surface opposite to the upper surface and a lateral surface between the upper surface and the lower surface;
   a light-transmissive member which is joined to the upper surface of the light emitting element, has a lower surface larger than the upper surface of the light emitting element and an upper surface smaller than the lower surface, and allows light emitted from the light emitting element to enter from the lower surface and exit from the upper surface of the light-transmissive member; and
   a covering member covering a lateral surface of the light-transmissive member such that the upper surface of the light-transmissive member is exposed from the covering member, wherein
   the light-transmissive member has a flange on at least a part of the lateral surface thereof in such a manner as to continue from a periphery of the upper surface to a periphery of the lower surface of the light-transmissive member and to be positioned outside the upper surface of the light-transmissive member and the upper surface of the light emitting element in plan view,
   the flange has a thin portion at an inner side than the outer edge side of the flange,
   the thin portion has a thickness smaller than a thickness of the outer edge side of the flange,
   the outer edge side of the flange has a thickness smaller than a thickness from the lower surface to the upper surface of the light-transmissive member, and
   the lateral surface of the light emitting element overlaps with the thin portion in plan view.

2. The light emitting device according to claim 1, wherein the thin portion is a groove along the outer edge of the flange.

3. The light emitting device according to claim 2, wherein the flange has a plurality of the grooves.

4. The light emitting device according to claim 1, wherein the flange has irregularities on a surface thereof.

5. The light emitting device according to claim 1, wherein the thin portion is positioned overlap with the periphery of the upper surface of the light-transmissivity member in plan view.

6. The light emitting device according to claim 1, wherein the flange has an inclined surface extending from the upper surface to the lower surface of the light-transmissive member.

7. The light emitting device according to claim 6, wherein the inclined surface is a curved surface.

8. The light emitting device according to claim 1, wherein the light-transmissive member has a rectangular shape in plan view, and has the flange on at least one side of the rectangular shape.

9. The light emitting device according to claim 8, wherein the light-transmissive member has a long side and a short side in plan view, and the flange is provided on the long side of the light-transmissive member.

10. The light emitting device according to claim 1, wherein the light- transmissive member has a lateral surface which is substantially perpendicularly connected to the upper surface and the lower surface of the light-transmissive member.

11. The light emitting device according to claim 1, wherein the light- transmissive member contains a fluorescent material.

12. The light emitting device according to claim 1, wherein the light- transmissive member and the light emitting element are bonded to each other with an adhesive material interposed therebetween.

13. A method of manufacturing a light emitting device comprising:
   forming a groove portion on an upper surface of a light-transmissive substrate having a plate shape;
   forming a light-transmissive member by dividing the light-transmissive substrate at a position including the groove portion, such that the light-transmissive member has a lower surface larger than an upper surface serving as a light extraction surface of a light emitting element, and an upper surface smaller than the lower surface, and having a flange which continues from a periphery of the upper surface to a periphery of the lower surface of the light-transmissive member, the flange being positioned outside the upper surface of the light-transmissive member and the upper surface of the light emitting element in plan view; and bonding the lower surface of the light-transmissive member and the upper surface of the light emitting element to each other, wherein the step of forming the light-transmissive member includes forming a thin portion at an inner side than an outer edge side of the flange, and the thin portion has a thickness smaller than a thickness of the outer edge side of the flange, and the outer edge side of the flange has a thickness smaller than a thickness from the lower surface to the upper surface of the light-transmissive member, wherein the light emitting element has a lower surface opposite to the upper surface and a lateral surface between the upper surface and the lower surface, and the lateral surface of the light emitting element overlaps with the thin portion in plan view.

14. The method of manufacturing a light emitting device according to claim 13, wherein the step of forming the light-transmissive member includes forming the light-transmissive member in a rectangular shape in plan view, and forming the flange on at least one side of the rectangular shape.

15. The method of manufacturing a light emitting device according to claim 14, wherein the step of forming the light-transmissive member includes forming the light-transmissive member having a long side and a short side, and forming the flange on the long side of the light- transmissive member.

16. The method of manufacturing a light emitting device according to claim 15, further comprising providing a covering member covering a-the lateral surface of the light emitting element, a lateral surface of the light-transmissive member and the flange after the step of forming the light-transmissive member.

* * * * *